United States Patent
Ancis et al.

(10) Patent No.: US 9,882,563 B2
(45) Date of Patent: Jan. 30, 2018

(54) METHOD FOR REDUCING OVERDRIVE NEED IN MOS SWITCHING AND LOGIC CIRCUIT

(71) Applicant: Dialog Semiconductor B.V., 's-Hertogenbosch (NL)

(72) Inventors: Michele Ancis, Sint-Michielsgestel (NL); Rahul Todi, Eindhoven (NL)

(73) Assignee: Dialog Semiconductor B.V., Hertogenbosch (NL)

( * ) Notice: Subject to any disclaimer, the term of this patent is extended or adjusted under 35 U.S.C. 154(b) by 0 days.

(21) Appl. No.: 13/853,305

(22) Filed: Mar. 29, 2013

(65) Prior Publication Data
US 2014/0266326 A1    Sep. 18, 2014

(30) Foreign Application Priority Data

Mar. 15, 2013 (EP) .................................. 13001322

(51) Int. Cl.
 *H03K 19/013* (2006.01)
 *H03K 19/00* (2006.01)
 *H03K 19/0185* (2006.01)

(52) U.S. Cl.
CPC ..... *H03K 19/0013* (2013.01); *H03K 19/0021* (2013.01); *H03K 19/0027* (2013.01); *H03K 19/018521* (2013.01)

(58) Field of Classification Search
CPC ........... H03K 19/0013; H03K 19/0021; H03K 19/0027
USPC ........................................ 327/374, 376, 377
See application file for complete search history.

(56) References Cited

U.S. PATENT DOCUMENTS

| | | | | |
|---|---|---|---|---|
| 3,676,801 A | * | 7/1972 | Musa | 331/116 FE |
| 3,828,203 A | * | 8/1974 | Belson et al. | 327/126 |
| 3,889,211 A | * | 6/1975 | Morozumi | 331/116 FE |
| 4,110,565 A | * | 8/1978 | Gaetano | H04Q 3/00 379/236 |
| 4,209,713 A | * | 6/1980 | Satou | H03K 17/162 257/376 |
| 4,321,562 A | * | 3/1982 | Igarashi | 331/116 FE |

(Continued)

OTHER PUBLICATIONS

Co-pending U.S. Appl. No. 13/853,238, filed Mar. 29, 2013, "Method for Charge/Sharing/Reuse of Electronic Circuits," by Michele Ancis et al., 25 pgs.

(Continued)

*Primary Examiner* — Thomas J Hiltunen
(74) *Attorney, Agent, or Firm* — Saile Ackerman LLC; Stephen B. Ackerman

(57) ABSTRACT

The present disclosure relates to methods and circuits to lowering the signal range of switching or logic circuits below supply range. The circuits may have one or more stages. The supply levels can be set individually for each stage. This may realize amplifiers/attenuators, both digitally and analogically controlled, based on progression and/or modulation in the supply range from stage to stage. A chain of stages can provide the desired power gain by setting the supply progression according to the nature of the incoming signals. The signal levels are lowered by generic device networks comprising voltage sources providing voltages independent of currents flowing through. Decoupling the signal amplitude from DC biasing allows for the signal swing to be lower than threshold voltages of the active devices.

22 Claims, 4 Drawing Sheets

(56) References Cited

U.S. PATENT DOCUMENTS

| | | | |
|---|---|---|---|
| 4,346,350 A * | 8/1982 | Morokawa et al. | 331/116 FE |
| 4,352,073 A * | 9/1982 | Leuthold | 330/264 |
| 4,622,512 A * | 11/1986 | Brokaw | G05F 3/30 323/313 |
| 4,783,603 A * | 11/1988 | Goforth et al. | 326/71 |
| 4,791,321 A * | 12/1988 | Tanaka et al. | 326/27 |
| 4,794,283 A * | 12/1988 | Allen et al. | 326/68 |
| 4,833,342 A * | 5/1989 | Kiryu | G05F 3/247 323/313 |
| 4,833,350 A * | 5/1989 | Frisch | H03K 19/09448 326/64 |
| 4,847,518 A * | 7/1989 | Leidich | G01R 1/20 327/315 |
| 4,996,499 A * | 2/1991 | Zarabadi et al. | 330/264 |
| 5,012,141 A * | 4/1991 | Tomisawa | G11B 20/10009 327/276 |
| 5,117,131 A * | 5/1992 | Ochi | H03K 19/018521 326/103 |
| 5,179,298 A * | 1/1993 | Hirano | H03K 17/167 326/27 |
| 5,208,558 A * | 5/1993 | Shigehara et al. | 331/116 FE |
| 5,289,425 A * | 2/1994 | Horiguchi et al. | 365/226 |
| 5,329,184 A * | 7/1994 | Redfern | H03K 19/00384 326/30 |
| 5,331,296 A * | 7/1994 | Davis | 331/158 |
| 5,534,810 A * | 7/1996 | White | 327/308 |
| 5,541,885 A * | 7/1996 | Takashima | G11C 5/147 365/208 |
| 5,705,946 A * | 1/1998 | Yin | 327/333 |
| 5,796,296 A * | 8/1998 | Krzentz | G05F 3/247 327/530 |
| 5,818,212 A * | 10/1998 | Min | G05F 1/465 323/314 |
| 5,894,244 A * | 4/1999 | Ukita | G05F 1/465 327/525 |
| 6,057,729 A * | 5/2000 | Nomura | 327/592 |
| 6,147,513 A * | 11/2000 | Bui | H03K 19/0027 326/83 |
| 6,307,402 B1 * | 10/2001 | Hedberg | H03K 19/018571 326/115 |
| 6,400,192 B2 * | 6/2002 | Boezen et al. | 327/112 |
| 6,411,169 B1 * | 6/2002 | Yabe et al. | 331/116 FE |
| 6,452,422 B1 * | 9/2002 | Suzuki | H03K 17/145 326/112 |
| 6,489,815 B2 * | 12/2002 | Ohno | H03K 5/133 326/27 |
| 6,531,886 B1 * | 3/2003 | Eichfeld et al. | 326/21 |
| 6,570,450 B2 * | 5/2003 | Nilson et al. | 330/264 |
| 6,686,899 B2 * | 2/2004 | Miyazawa | G09G 3/3648 326/81 |
| 6,714,046 B2 * | 3/2004 | Fujikawa | H03K 19/018571 326/62 |
| 6,794,905 B2 * | 9/2004 | Sato et al. | 326/108 |
| 6,798,306 B2 * | 9/2004 | Kurosawa | 331/158 |
| 6,861,739 B1 * | 3/2005 | Bhavnagarwala et al. | 257/691 |
| 6,933,795 B2 * | 8/2005 | Nimura | 331/158 |
| 6,937,071 B1 * | 8/2005 | Moraveji | 327/54 |
| 7,019,576 B1 * | 3/2006 | Sancheti | H03H 11/265 327/261 |
| 7,034,605 B2 * | 4/2006 | Otsuka et al. | 327/540 |
| 7,061,279 B1 * | 6/2006 | Leete | H03F 3/191 327/108 |
| 7,123,237 B2 * | 10/2006 | Sato | G09G 3/3611 345/98 |
| 7,167,036 B2 * | 1/2007 | Fournel | H03K 19/018521 326/81 |
| 7,224,186 B2 * | 5/2007 | Tsukada | H03K 19/0013 326/68 |
| 7,411,318 B2 * | 8/2008 | Kimura | H03K 19/01728 307/113 |
| 7,519,130 B2 * | 4/2009 | Hsu | H04L 25/0274 326/30 |
| 7,525,345 B2 * | 4/2009 | Jang | H03K 19/0013 326/83 |
| 7,564,259 B2 | 7/2009 | Agarwal et al. | |
| 7,698,610 B2 * | 4/2010 | Gomez Arguello | G01R 31/31717 714/724 |
| 7,932,745 B2 * | 4/2011 | Hecht et al. | 326/40 |
| 8,035,443 B2 * | 10/2011 | Narathong et al. | 330/51 |
| 8,143,963 B2 * | 3/2012 | Lin | H03L 1/022 331/116 FE |
| 8,149,023 B2 * | 4/2012 | Rajagopalan | H03K 17/6872 327/108 |
| 8,183,713 B2 | 5/2012 | Rao et al. | |
| 8,278,904 B2 | 10/2012 | Jensen et al. | |
| 8,294,473 B2 * | 10/2012 | Butler et al. | 324/538 |
| 8,315,588 B2 * | 11/2012 | Randazzo | 455/343.1 |
| 8,319,530 B2 * | 11/2012 | Zhao et al. | 327/112 |
| 8,324,966 B2 * | 12/2012 | Goldfarb | 330/124 R |
| 8,415,991 B2 * | 4/2013 | Rangarajan | H03K 17/6872 327/108 |
| 8,513,997 B2 * | 8/2013 | Hesen et al. | 327/175 |
| 8,674,755 B2 * | 3/2014 | Soe | 327/563 |
| 8,787,850 B2 * | 7/2014 | Bockelman | H03F 1/086 330/292 |
| 8,957,708 B2 * | 2/2015 | Miyazaki | G05F 1/10 327/108 |
| 9,246,436 B2 * | 1/2016 | Lemkin | H03D 7/1441 |
| 9,679,623 B2 * | 6/2017 | Todi | G11C 7/22 |
| 2002/0125965 A1 * | 9/2002 | Hasegawa et al. | 331/158 |
| 2002/0140458 A1 | 10/2002 | Sato et al. | |
| 2004/0246760 A1 * | 12/2004 | Hirabayashi | H03F 3/3022 365/145 |
| 2008/0252363 A1 | 10/2008 | Osame et al. | |
| 2009/0027131 A1 * | 1/2009 | Suzuki | 331/57 |
| 2010/0321089 A1 * | 12/2010 | Choy | 327/427 |

OTHER PUBLICATIONS

European Search Report 13001322.0-1810 dated Jun. 28, 2013.

* cited by examiner

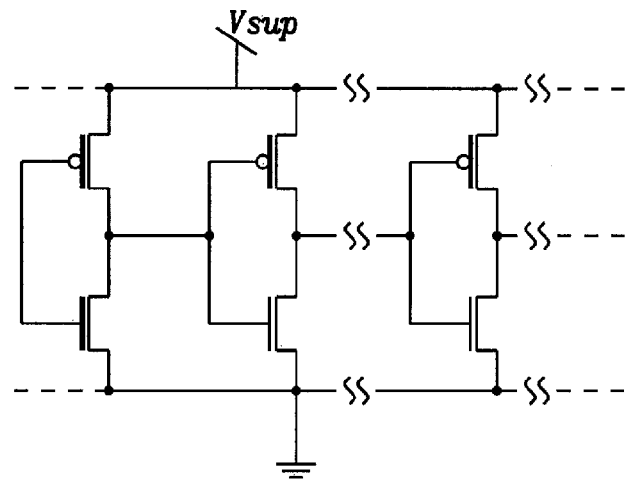
*FIG. 1- Prior Art*
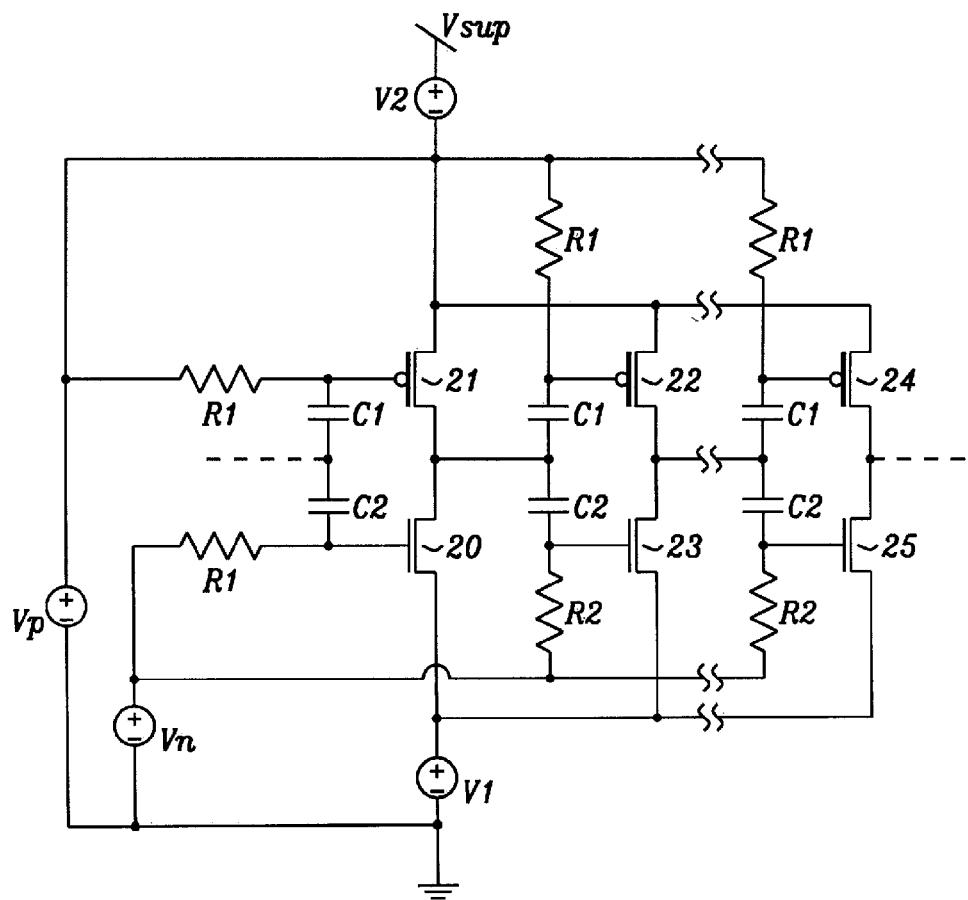
*FIG. 2*

METHOD FOR REDUCING OVERDRIVE NEED IN MOS SWITCHING AND LOGIC CIRCUIT

TECHNICAL FIELD

The present document relates to electronic switching and logic circuits. In particular, the present document relates to lowering the signal range below system supply range.

BACKGROUND

Switching and logic circuits provide waveforms which are the result of operations upon one or more input signals.

The current practice for this type of circuits is to operate them at full, range of available supply. The power consumption of such a circuit can be expressed by:

$$P_{dyn} = C_L \times V^2 \times f \times \alpha$$

from which it is apparent that the power consumption of such circuits depends quadratically on the supply value (V), and linearly on capacitive load ($C_L$), frequency of operation (f), and activity factor ($\alpha$). The activity factor defines the ratio of the actual average number of transitions per second, divided by the maximum number of the same.

The disadvantage of this practice is the use of full supply range leading to unnecessarily high power consumption.

SUMMARY

A principal object of the present disclosure is to achieve signal amplitude swing of switching and logic circuits independent of supply range.

A further principal object of the disclosure is to achieve a power optimum amplitude swing depending upon frequency, activity factor, technology characteristics (load of the structures, drive strength of active devices) as constraints.

A further object of the disclosure is to realize a whole family of logic circuits based on supply reduction and AC coupling concepts.

A further object of the disclosure is to increase speed and drive strength of switching and logic circuits.

A further object of the disclosure is to realize amplifiers/attenuators, both digitally and analogically controlled, based on progression/modulation in the signal swing from stage to stage.

In accordance with the objects of this disclosure a method to lower signal range of a switching and logic circuits below supply range in order to optimize amplitude swing in regard of power consumption has been achieved. The method disclosed comprises the steps of: (1) providing a switching or logic circuit with positive and negative supply rails comprising one or more stages, (2) lowering the signal range below the supply range by adding for each circuit stage one or two generic device networks, wherein each generic device network establishes a voltage drop between the circuit and an associated supply rail, wherein the signal swings between a positive reference voltage, provided by the voltage drop in regard of the positive supply rail, and a negative reference voltage, provided by the voltage drop in regard of the negative supply rail, and wherein each of the voltage drops is constant and is independent of current flowing through the generic device network, (3) decoupling the signal range from biasing voltages by providing a DC biasing network comprising biasing voltage sources providing biasing voltages as required and corresponding resistors providing impedances required, and (4) providing AC signal coupling of active devices of the circuit by a capacitive network.

In accordance with the objects of this disclosure a switching or logic circuit comprising one or more stages configured to a signal range below supply range in order to optimize amplitude swing in regard of power consumption has been achieved. The circuit disclosed comprises: one or two generic device networks implemented for each stage of the circuit adapted each to providing a positive and/or a negative reference voltage for each stage of the circuit while the reference voltages allow a signal range of each stage of the circuit below the supply range of the circuit, wherein the reference voltages are constant and independent of currents flowing through the one or two generic device networks of each stage, a DC biasing network biasing active devices of the circuit comprising biasing voltage sources providing biasing voltages as required and resistors providing impedances for biasing as required, and an AC coupling network of capacitive means to couple AC signals of a stage to a neighboring stage; wherein the DC biasing network and the AC coupling network are enabled to allow a signal range which may be lower than threshold voltages of the active devices of the circuit.

BRIEF DESCRIPTION OF THE FIGURES

The invention is explained below in an exemplary manner with reference to the accompanying drawings, wherein FIG. 1 prior art depicts as example a logic inverter chain wherein an output signal of one stage is DC coupled to the input of a subsequent stage, and the signal range coincides to the available supply.

FIG. 2 depicts a logic inverter chain as example of the proposed innovation

DETAILED DESCRIPTION

Figure 3:
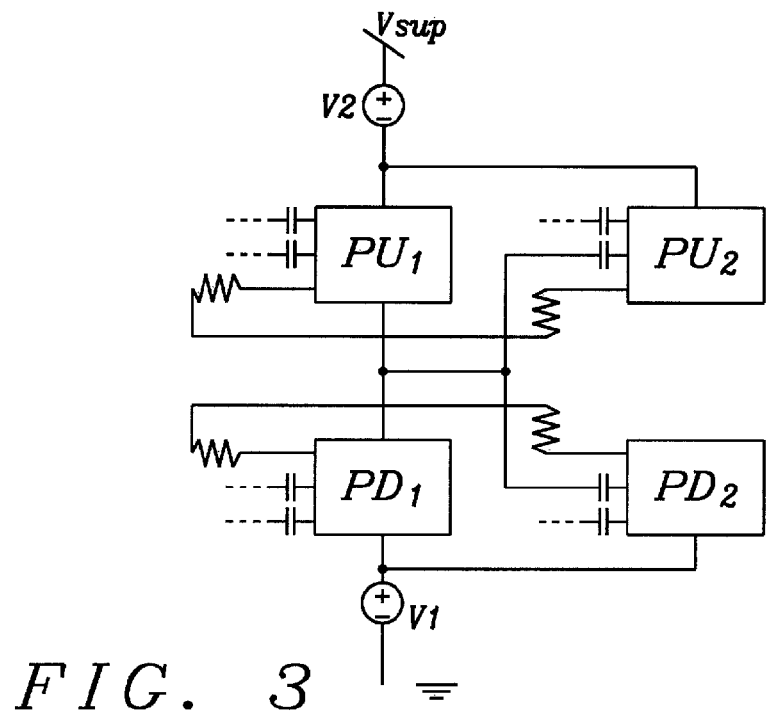
FIG. 3 illustrates generic pull up and pull down networks.

Methods and circuits to achieve power optimum amplitude swing depending upon frequency, activity factor, technology characteristics (load of the structures, drive strength of active devices) as constraints by setting signal amplitude swing independent of supply range are disclosed.

It should be noted that the disclosure is not only applicable to MOS technology but also to all other technologies wherein one port is used to control current flow through other ports, such as e.g. bipolar, JFET, and other technologies.

FIG. 1 prior art depicts, as example, a logic inverter chain, wherein an output signal of one stage is DC coupled to the input of a subsequent stage, and the signal range coincides to the available supply. This approach has the disadvantages outlined above.

FIG. 2 depicts a logic inverter chain as example of the proposed innovation, comprising:
  a device voltage source V1 lifting the lower inverter rail to a voltage above the reference of the embedding circuit;

a device voltage source V2 lowering the upper inverter rail to a voltage below the supply of the embedding circuit;

a network (voltage source Vn, R2) providing a DC voltage to the gates of the n-type devices 20, 23, and 25;

a network (voltage source Vp, R1) providing a DC voltage to the gate of the p-type devices 21, 22, and 24;

a network C2 providing a means to couple the AC signal to the input port of the n-type devices 20, 23, and 25; and a network C1 providing a means to couple the AC signal to the input port of the p-type device 21, 22, and 24.

Following the method of this example of FIG. 2, it is possible for the logic devices 21-25 to swing between the levels defined by voltages V1 and V2, while the load drive capability can be set independently by acting on Vp and Vn. The number of chain connected devices is arbitrary. The signal swing between V1 and V2 is obviously lower than a signal swing of prior art between $V_{sup}$ and ground.

Also important are the means of biasing the active devices 20-25 through voltage sources Vp, and Vn, plus the resistors R1 and R2. The resistors R1 and R2 are also important as they provide high impedance to the signal but otherwise allow DC. Exceptionally voltage sources or the resistors could be omitted for some instances, but they are normally required to achieve proper operation.

A coupling network, comprising in FIG. 2 capacitors C1 and C2, is coupling the signals to the devices.20-25.

An important feature of the disclosure is that the voltages V1 and V2, generated by the generic device networks (voltage sources), are independent of the currents flowing through them.

The elements pointed out in the example of FIG. 2: V1, V2, Vn, Vp, R1, R2, C1, and C2 are all essential for the most general operation of the disclosure. Their function can be implemented, however, with a variety of devices. For instance, voltage sources V1 or V2 can be an LDO, a DC/DC converter's output, a diode and so forth. The functions as described in the example of FIG. 2 have to be provided.

In special cases, some of the parameters can be set to zero value.

For the sake of generalization, the example shown in FIG. 2 can be extended in the following ways:

A—Generic Pull-up and Pull-down Networks, and Connections Thereof.

FIG. 3 illustrates implementing generic device pull up and pull down networks. With reference to FIG. 3, a "generic device pull-up network" can be devised, able to establish a low ohmic connection between the output of the circuit and the positive reference, based on a fixed pattern of the input signals, generally called a Pull-up network, PU1 and PU2.

Dually, a network providing a low ohmic path between the output of the circuit and the negative reference is termed a generic device Pull-down network, PD1 and PD2. A PU or PD can be established in many ways, e.g. by simple series/parallel device arrangements.

A generic device Pull-Up network (PU) network is a combination of devices able to tie the output of a stage to the upper reference voltage and accordingly a generic device Pull-Down network (PD) network is just a combination of devices able to tie the output of the stage to the lower reference voltage. Pull-Up really means "pull output to supply" and Pull-Down really means "pull output to ground". However, in the circuits of the present disclosure "supply" and "ground" are not those of the system, but especially created ones using the voltage sources of the generic devices network generating the upper reference voltage and the lower reference voltage.

It should be noted that the voltage drops from supply rails to upper and lower circuit reference is established by the voltage sources V1 and V2, which we call "generic device networks". A PU or PD can be established in many ways.

The nature of the generic device networks or generic device Pull-down/Pull-up network, doesn't have to be MOS nor complementary, other technologies such as e.g. bipolar, JFET, and other technologies are also possible.

One key objective of the generalization in regard of generic device Pull-up and Pull-down networks, and connections thereof is to realize a whole family of logic circuits based on supply reduction and AC coupling concepts. This family may include combinational and sequential, i.e. including memory elements. In digital circuit theory, combinational logic (sometimes also referred to as combinatorial logic or time-independent logic) is a type of digital logic which is implemented by boolean circuits, where the output is a pure function of the present input only. This is in contrast to sequential logic, in which the output depends not only on the present input but also on the history of the input. In other words, sequential logic has memory while combinational logic does not.

This family of logic circuits may comprise all standard logic components such as e.g. AND, OR, INV, NAND, NOR, XOR, XNOR, plus memory elements such as Flip-Flops, etc., using technologies for example such as CMOS, TTL, ECL, etc. This includes also as non-limiting example pass transistor logic (PTL) as well, as for example latches and memory elements. In electronics, pass transistor logic describes several logic families used in the design of integrated circuits. It reduces the count of transistors used to make different logic gates, by eliminating redundant transistors. Transistors are used as switches to pass logic levels between nodes of a circuit, instead of as switches connected directly to supply voltages.

Figure 6:
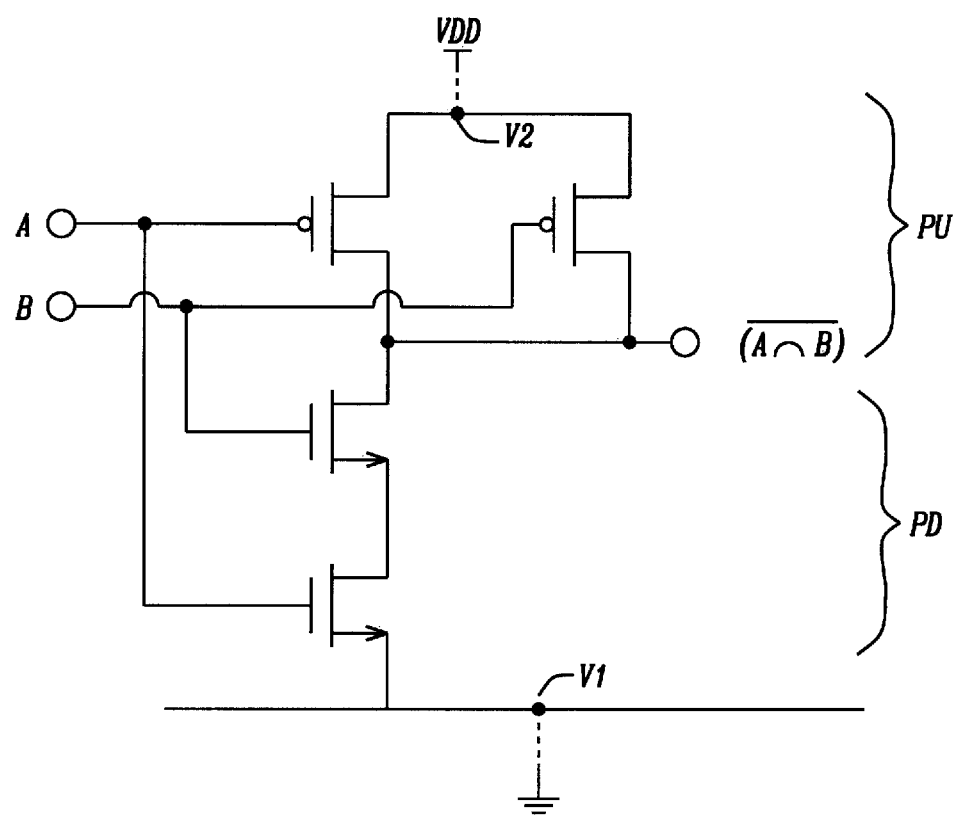
FIG. 6 shows for example a circuit diagram of a NAND logic component showing a pull-down network PD and a pull-up network PU.

FIG. 6 shows for example a circuit diagram of a NAND logic component showing a pull-down network PD and a pull-up network PU. The current sources to generate voltages V1 and V2, which could be implemented in many different ways, are indicated by dashed lines showing connections to supply VDD and ground (the AC connections are omitted). The output signal for the NAND logic component swings between V1 and V2. This NAND logic component including PU and PD may be a member of the family of logic components.

Returning to AC coupling concepts it is well known that transistors have threshold voltages. They can be turned ON or OFF according to the value of a voltage, between a controlling terminal and a reference terminal. If the value of this voltage is greater/lower than the threshold voltage $V_{th}$, then the transistor allows/blocks flow of charge from its other terminal to the reference terminal. It is therefore important to allow for controlling signals to rise above and below the tech constant threshold voltage $V_{th}$. In most circuits at hand, for direct input-output coupling as in the Prior Art, this value of the voltage rises to the supply voltage. That is, it is not possible to lower supply range below ($V_{th}+V_{ov}$), where $V_{ov}$ is needed to allow a target charge flow (drive strength).

However, decoupling the signal amplitude from the DC biasing as described in the disclosure, allows for the signal swing, i.e. the reference-to-reference voltage, to be lower than $V_{th}$, because the maximum signal present at the controlling port of the device is now $V_{bias}+V_{swing}$ and it is this new quantity that needs to reach $V_{th}+V_{ov}$. This is of course much easier to achieve because voltage $V_{bias}$ can be set as desired. $V_{bias}$ corresponds to one of the voltages $V_n$, or $V_p$ in FIG. 2.

B—Non Constant Supply Levels Between Stages

Figure 4:
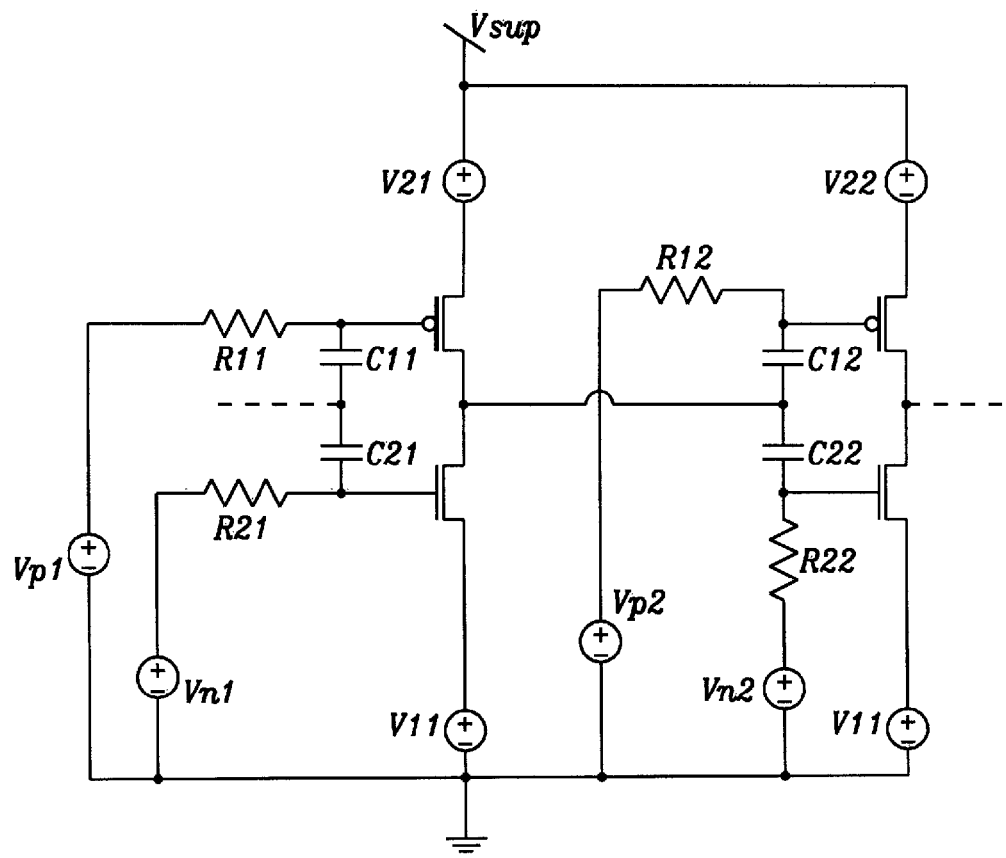
FIG. 4 shows an extension to support non constant voltage swings between subsequent stages.

FIG. 4 shows an extension to support non constant voltage swing between subsequent stages. With reference to FIG. 4, a varying (decreasing or increasing) biasing voltage scheme can be achieved for (V11, V12, V21 V22, Vn1, Vn2, Vp1, and Vp2) between interconnected stages as to provide amplification or reduction of the power level associated with a certain signal. Number of interconnected stages is arbitrary. The circuit may be obviously extended including V1x, V2x, Vnx, and Vpx.

One key objective of the generalization in regard of non-constant supply levels between stages is to realize amplifiers/attenuators, both digitally and analogically controlled based on the method disclosed of a progression/modulation in the supply range from stage to stage. With reference to FIG. 4, a chain of stages can provide the desired power gain by setting the supply progression according to the nature of the incoming signal.

Figure 5:
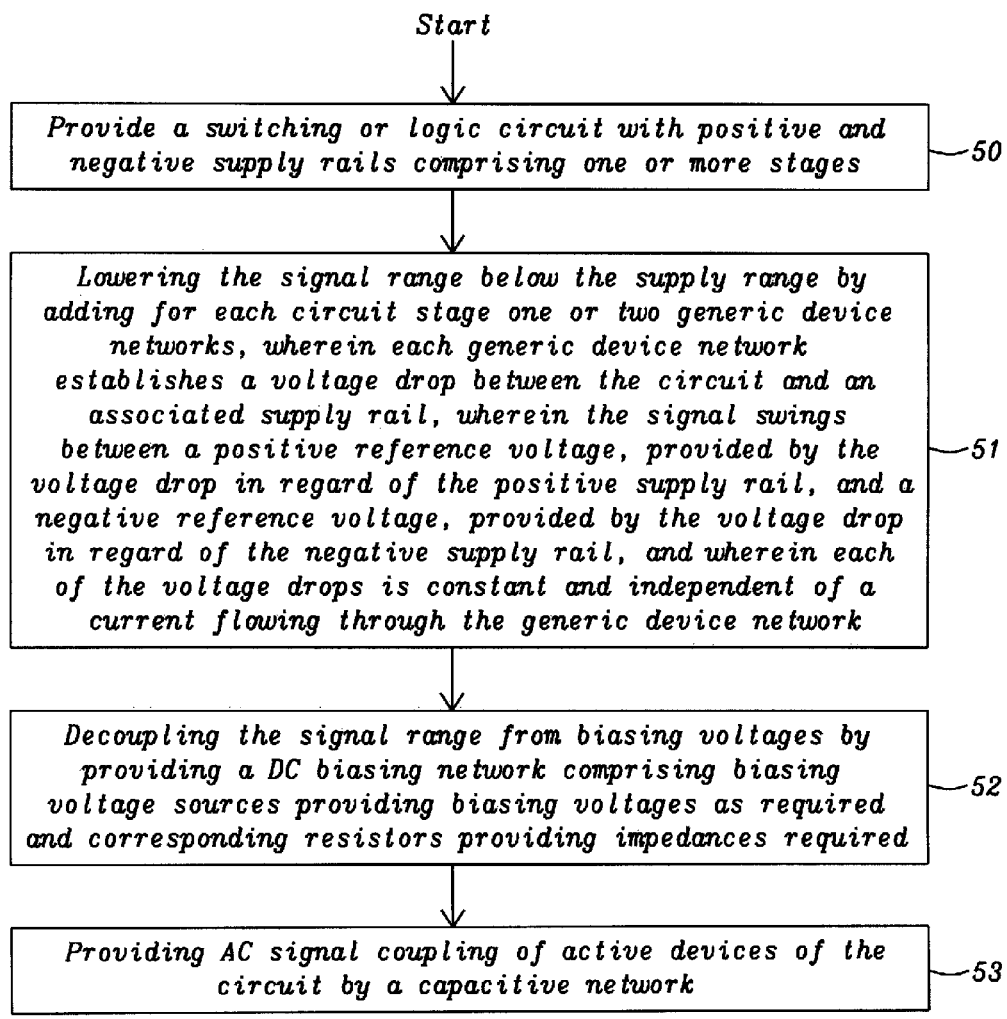
FIG. 5 shows a flowchart of a method to lower a signal range of switching and logic and logic circuits below supply range in order to optimize amplitude swing in regard of power consumption.

Furthermore it should be noted that the present disclosure enhances circuit speed, because this is direct function of signal swing range, load to be driven, and current capability (drive strength) by providing a DC biasing network comprising biasing voltage sources providing biasing voltages as required and corresponding resistors providing impedances required FIG. 5 shows a flowchart of a method to lower signal range of switching and logic and logic circuits below supply range in order to optimize amplitude swing in regard of power consumption.

A first step 50 depicts a provision of a switching or logic circuit with positive and negative supply rails comprising one or more stages. The next step 51 shows lowering the signal range below the supply range by adding for each circuit stage one or two generic device networks, wherein each generic device network establishes a voltage drop between the circuit and an associated supply rail, wherein the signal swings between a positive reference voltage, provided by the voltage drop in regard of the positive supply rail, and a negative reference voltage, provided by the voltage drop in regard of the negative supply rail, and wherein each of the voltage drops is constant and is independent of a current flowing through the generic device networks. Step 52 is following describing decoupling the signal range from biasing voltages by providing a DC biasing network comprising biasing voltage sources providing biasing voltages as required and corresponding resistors providing impedances required, and the last step 53 discloses providing AC signal coupling of active devices of the circuit by a capacitive network.

While the invention has been particularly shown and described with reference to the preferred embodiments thereof, it will be understood by those skilled in the art that various changes in form and details may be made without departing from the spirit and scope of the invention.

What is claimed is:

1. A method to lower signal range of a switching and/or logic circuit below supply range in order to optimize amplitude swing in regard of power consumption, the method comprising the steps of:
   (1) providing a switching or logic circuit with positive and negative supply rails comprising one or more stages, wherein each stage comprises one or more transistors, a circuitry configured to driving the transistors, an input port, and an output port and wherein neighboring stages have input and output ports interconnected;
   (2) lowering the signal range below the supply range by adding for each circuit stage one or two generic device networks, wherein each generic device network comprises a voltage source configured to establish a voltage drop between the circuit and an associated supply rail, wherein the signal swings between a positive reference voltage, provided by the voltage drop in regard of the positive supply rail, and a negative reference voltage, provided by the voltage drop in regard of the negative supply rail, and wherein each of the voltage drops is constant and is independent of current flowing through the generic device networks;
   (3) decoupling the signal range from biasing voltages by providing a DC biasing network comprising biasing voltage sources providing biasing voltages applied to gates of the transistors as required and corresponding resistors providing impedances required, wherein negative terminals of all said biasing voltage sources are directly connected to ground and wherein said biasing voltage sources are set separately of the one or two generic device networks; and
   (4) providing AC signal coupling of active devices of the circuit by a capacitive network;
   wherein the switching or logic circuit is configured to enable different voltage swings of each subsequent stages while using a same supply voltage by implementing a varying generic device network scheme for each stage and wherein the AC coupling network and the DC biasing network allow signal swings lower than threshold voltages of active devices of the circuit.

2. The method of claim 1, wherein each stage of the circuit comprises a generic device Pull-Down network (PD) and a generic device Pull-Up network (PU), wherein a Pull-Up network (PU) network is a combination of devices able to tie the output of a stage to the upper reference voltage and a Pull-Down network (PD) network is a combination of devices able to tie the output of a stage to the lower reference voltage.

3. The method of claim 1, wherein the method is used to build a family of combinational and sequential logic circuits.

4. The method of claim 3, wherein the family of logic circuits includes pass transistor logic circuits.

5. The method of claim 4, wherein the pass transistor logic circuits include latches and memory elements.

6. The method of claim 3, wherein the family of logic circuits comprises AND, OR, INV, NAND, NOR, XOR, and XNOR logic circuits.

7. The method of claim 1, wherein specific signal ranges for each circuit stage can be achieved by decreasing or increasing the voltage drop of the one or two generic device networks associated to the stage where the signal range should be adapted.

8. The method of claim 1, wherein amplifiers/attenuators, both digitally and analogically controlled, are realized based on progression/modulation in the supply range from stage to stage.

9. The method of claim 1, wherein the circuit is a MOS circuit.

10. The method of claim 1, wherein the circuit is built using any of semiconductor technologies wherein one port is used to control current flow through other ports.

11. The method of claim 1, further comprising defining drive strength of the signals of the circuit by setting accordingly the biasing voltages.

12. A switching or logic circuit comprising one or more stages configured to providing a signal range below supply range in order to optimize amplitude swing in regard of power consumption, wherein each stage comprises one or more transistors configured to perform the switching or logic functions of the circuit, a circuitry configured to driving the transistors transistors configured to perform the switching or logic functions of the circuit, an input port, and an output port and wherein neighboring stages have input and output ports interconnected, comprising:

positive and negative supply rails;

one or two generic device networks implemented for each stage of the circuit adapted each to providing a positive and/or a negative reference voltage for each stage of the circuit while the reference voltages allow a signal range of each stage of the circuit below the supply range of the circuit, thus configured to enable different voltage swings of each stage while using a same supply voltage by implementing a varying generic device network scheme for each stage, wherein the supply range is provided by said positive and negative supply rails and wherein the reference voltages are constant and independent of currents flowing through the one or two generic device networks of each stage, wherein each generic network comprises a voltage source configured to establish a voltage drop between the circuit and an associated supply rail;

a DC biasing network biasing active devices of the circuit comprising biasing voltage sources providing biasing voltages applied to the gates of the transistors configured to perform the switching or logic functions as required and resistors providing impedances for biasing as required, wherein negative terminals of all said biasing voltage sources are directly connected to ground and wherein said biasing voltage sources are set separately of the one or two generic device networks; and an AC coupling network of capacitive means to couple AC signals of a stage to a neighboring stage;

wherein the AC coupling network and the DC biasing network allow signal swings lower than threshold voltages of active devices of the circuit.

13. The circuit of claim 12 wherein each stage of the circuit comprises a generic device pull-down network (PD) and a generic device pull-up network (PU), wherein a Pull-Up network (PU) network is a combination of devices able to tie the output of a stage to the upper reference voltage and a Pull-Down network (PD) network is a combination of devices able to tie the output of a stage to the lower reference voltage.

14. The circuit of claim 12 wherein the circuit is adapted to decoupling the signal range from the DC biasing voltages by the DC biasing network and the AC coupling network allowing a signal swing lower than a threshold voltage of active devices of the circuit.

15. The circuit of claim 12 wherein the circuit is a part of a family of combinational and sequential logic circuits.

16. The circuit of claim 15 wherein the family of logic circuits includes pass transistor logic circuits.

17. The circuit of claim 16 wherein the pass transistor logic circuits include latches and memory elements.

18. The circuit of claim 15 wherein the family of logic circuits comprises AND, OR, INV, NAND, NOR, XOR, and XNOR logic circuits.

19. The circuit of claim 12 wherein specific signal ranges for each circuit stage can be achieved by decreasing or increasing the voltage drop of the one or two generic device networks associated to the stage where the signal range should be adapted.

20. The circuit of claim 12 wherein drive strength of the signals of the circuit are defined by setting accordingly the biasing voltages.

21. The circuit of claim 12 wherein the circuit is a MOS circuit.

22. The circuit of claim 12 wherein the circuit is built using any of semiconductor technologies wherein one port is used to control current flow through other ports.

* * * * *